US 10,440,834 B2

(12) United States Patent
Hino et al.

(10) Patent No.: US 10,440,834 B2
(45) Date of Patent: Oct. 8, 2019

(54) RESIN FLUXED SOLDER PASTE, AND MOUNT STRUCTURE

(71) Applicant: Panasonic Intellectual Property Management Co., Ltd., Osaka (JP)

(72) Inventors: Hirohisa Hino, Osaka (JP); Naomichi Ohashi, Hyogo (JP); Yuki Yoshioka, Osaka (JP); Masato Mori, Hyogo (JP); Yasuhiro Suzuki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 246 days.

(21) Appl. No.: 15/352,264

(22) Filed: Nov. 15, 2016

(65) Prior Publication Data
US 2017/0188468 A1    Jun. 29, 2017

(30) Foreign Application Priority Data
Dec. 28, 2015    (JP) .................... 2015-256872

(51) Int. Cl.
| | | |
|---|---|---|
| *C09J 163/00* | (2006.01) | |
| *C09J 9/02* | (2006.01) | |
| *C09J 11/02* | (2006.01) | |
| *C09J 11/04* | (2006.01) | |
| *C09J 11/06* | (2006.01) | |
| *C08K 3/10* | (2018.01) | |
| *C08K 3/36* | (2006.01) | |
| *C08K 9/04* | (2006.01) | |
| *H05K 3/34* | (2006.01) | |
| *H01L 23/00* | (2006.01) | |
| *H05K 1/11* | (2006.01) | |
| *H05K 1/18* | (2006.01) | |
| *B23K 35/24* | (2006.01) | |
| *H01L 23/498* | (2006.01) | |

(52) U.S. Cl.
CPC .......... *H05K 3/3489* (2013.01); *B23K 35/24* (2013.01); *H01L 24/13* (2013.01); *H01L 24/16* (2013.01); *H01L 24/81* (2013.01); *H05K 1/11* (2013.01); *H05K 1/18* (2013.01); *H05K 3/34* (2013.01); *H05K 3/3457* (2013.01); *H05K 3/3463* (2013.01); *H01L 23/49883* (2013.01); *H01L 2224/133* (2013.01); *H01L 2224/13023* (2013.01); *H01L 2224/1329* (2013.01); *H01L 2224/1349* (2013.01); *H01L 2224/13294* (2013.01); *H01L 2224/13311* (2013.01); *H01L 2224/13313* (2013.01); *H01L 2224/13387* (2013.01); *H01L 2224/13499* (2013.01); *H01L 2224/1601* (2013.01); *H01L 2224/16013* (2013.01); *H01L 2224/16058* (2013.01); *H01L 2224/16227* (2013.01); *H01L 2224/16505* (2013.01); *H01L 2224/8121* (2013.01); *H01L 2224/81193* (2013.01); *H01L 2224/81815* (2013.01); *H01L 2224/81862* (2013.01); *H01L 2224/81905* (2013.01); *H01L 2924/0105* (2013.01); *H01L 2924/01029* (2013.01); *H01L 2924/01047* (2013.01); *H05K 3/3436* (2013.01); *H05K 3/3484* (2013.01); *H05K 2201/0209* (2013.01); *H05K 2201/0227* (2013.01)

(58) Field of Classification Search
None
See application file for complete search history.

(56) References Cited

U.S. PATENT DOCUMENTS

| | | |
|---|---|---|
| 2009/0047534 A1 | 2/2009 | Sakai et al. |
| 2009/0269598 A1 | 10/2009 | Ohashi et al. |
| 2010/0062552 A1* | 3/2010 | Miyawaki ............... C08L 83/04 438/26 |
| 2011/0284265 A1 | 11/2011 | Sakai et al. |
| 2012/0256312 A1 | 10/2012 | Tsujimoto |
| 2014/0367867 A1 | 12/2014 | Lin et al. |

FOREIGN PATENT DOCUMENTS

| | | | | |
|---|---|---|---|---|
| JP | 2007-280999 | | 10/2007 | |
| JP | 2009-283453 | | 12/2009 | |
| JP | 2010077271 A | * | 4/2010 | ............ C08L 101/00 |
| JP | 2011-036901 A | | 2/2011 | |
| JP | 2011-142119 | | 7/2011 | |
| JP | 2014-209624 A | | 11/2014 | |

OTHER PUBLICATIONS

Machine translation of JP-2010077271-A (no date).*

* cited by examiner

*Primary Examiner* — Michael J Feely
(74) *Attorney, Agent, or Firm* — Panasonic IP Management; Kerry S. Culpepper

(57) ABSTRACT

Provided herein is a resin fluxed solder paste that exhibits a desirable solder bump reinforcement effect without requiring an underfill process. The disclosure also provides a mount structure. The resin fluxed solder paste includes a non-resinic powder containing a solder powder and an inorganic powder; and a flux containing a first epoxy resin, a curing agent, and an organic acid. The non-resinic powder accounts for 30 to 90 wt % of the total, and the surface of the inorganic powder is covered with an organic resin.

1 Claim, 5 Drawing Sheets

RESIN FLUXED SOLDER PASTE, AND MOUNT STRUCTURE

TECHNICAL FIELD

The technical field relates mainly to solder pastes used for soldering of components such as semiconductor components and electronic components to a circuit board, specifically resin fluxed solder pastes containing an epoxy resin-containing flux component, and to a mount structure.

BACKGROUND

Mobile devices such as cell phones and PDAs (Personal Digital Assistants) have never been smaller and more functional. A variety of mount structures such as BGA (Ball Grid Array), and CSP (Chip Scale Package) are available as a mount technology for accommodating such advancements. Mobile devices are prone to mechanical load such as dropping impact. A QFP (Quad Flat Package) absorbs such impact with its lead portions. However, BGA and CSP do not have leads that relieve impact, and it is important to provide reliability against impact resistance in these structures.

Common Pb eutectic solders have a melting point of 183° C. Sn—Ag—Cu-based solders, a typical example of modern lead-free solders, have melting points about 30° C. higher than the melting point of Pb eutectic solders. This has raised the reflow furnace profile temperature to as high as 220 to 260° C. For mounting of components having weak high-temperature resistance to a circuit beard, such components are separately joined in a separate step by spot soldering. This has posed a serious drawback in productivity.

Under these circumstances, low-melting-point Pb-free solders of Sn—Sn, Sn—Ag—In, or Sn—Bi have been used lately to overcome the disadvantageous high melting points of Sn—Ag—Cu-based solders (hereinafter, "SAC solder"). However, a BGA connection using Sn—Zn—, Sn—Ag—In—, or Sn—Bi-based solders has not been fully established with regard to the interconnection reliability of the solder joint, particularly reliability against impact resistance.

SUMMARY

In order to improve the reliability of a joint against impact resistance, a semiconductor mount structure using a solder paste containing a thermosetting resin in a flux (hereinafter, "resin fluxed solder paste"), and a method of production thereof have been proposed (see, for example, JP-A-2009-283453).

As an example of a composition of such a resin fluxed solder paste, a paste is available that includes a solder powder, and a flux configured from an epoxy resin, a curing agent, an organic acid, and a thickener.

As another approach to improve the drop reliability of a mount structure, a method is proposed in which terminals 52 of a semiconductor component 51 such as a CSP are connected to electrodes 54 of a substrate 53 with a common SAC solder 55, and the strength of the interconnections is reinforced with the use of a liquid sealant 57 called an underfill (see, for example, JP-A-2011-142119). FIG. 4 is a schematic cross sectional view after traditional solder ball connection and reinforcement with the underfill 57. The underfill 57 is, for example, a low-viscosity liquid resin composition containing a liquid epoxy resin, a curing agent, and an inorganic powder 58 such as silica. Because the underfill 57 contains an inorganic powder 58 such as silica, the cured product can have a small coefficient of thermal expansion, and a large elastic modulus. This makes it possible to reduce the thermal expansion difference between the solder bump 55 of the CSP, and the resin of the underfill 57. In this way, the hard resin in the underfill 57 can reinforce the surroundings of the bump 55, and very high drop reliability can be ensured.

The underfill 57 is charged into a narrow space between a CSP chip and a circuit board by being allowed to permeate from the surroundings of the CSP chip through capillary action. The process involves mounting the CSP on the substrate 53 with the solder ball 55, and the long additional steps of washing the flux, charging the underfill, and curing the underfill. These add to the production cost of electronic devices, which need to be produced at the lowest manufacturing cost possible.

As one of the cost-cutting measures, a resin fluxed solder paste is used to connect the solder balls of a CSP to a circuit board, and the interconnections are simultaneously reinforced with the resin, instead of using the common SAC solder. Specifically, the resin is pushed around the solder, and forms a structure that reinforces the surroundings of the solder as the solder of the resin fluxed solder paste melts and connects to the solder balls of the CSP in reflow heating. In this way, resin reinforcement is possible without an underfill. This eliminates the need for flux washing, underfill charging, and underfill curing, and the number of steps can be reduced.

However, the approach using a resin fluxed solder paste is problematic because the drop reliability is not as desirable as that achieved by traditional underfill charging. The reason is two-fold. First, the Sn—Bi-based low-melting-point solder contained in a resin fluxed solder paste has more brittle characteristics than the SAC solder. A product, such as a mobile device, that is processed with a resin fluxed solder paste is accordingly more likely to break in a drop test than products using the SAC solder. Secondly, while the solder connection using a resin fluxed solder paste can reinforce the solder joint with resin, the reinforcing resin contains only resin, and, unlike the underfill, does not contain a filler such as silica. As such, the resin cured product has a larger coefficient of thermal expansion, and a smaller elastic modulus than the underfill. Because of these characteristics, the effect to reinforce the CSP solder bumps is smaller, and the drop resistance is not as reliable.

It is an object of the present disclosure to provide a resin fluxed solder paste that exhibits a desirable solder bump reinforcement effect without requiring an underfill process. The disclosure is also intended to provide a mount structure.

A resin fluxed solder paste according to an aspect of the present disclosure includes: a non-resinic powder containing a solder powder and an inorganic powder; and a flux containing a first epoxy resin, a curing agent, and an organic acid, wherein the non-resinic powder accounts for 30 to 90 wt % of the total, and wherein the surface of the inorganic powder is covered with an organic resin.

A mount structure according to an aspect of the present disclosure includes: a circuit board having an electrode; an electronic component having a terminal; a conducting portion including a solder connecting the electrode of the circuit board and the terminal of the electronic component to each other; and a reinforcing portion covering at least a portion of surroundings of the solder, and containing a cured first epoxy resin in which an inorganic powder is dispersed, wherein the surface of the inorganic powder in the reinforcing portion is covered with an organic resin.

The resin fluxed solder paste according to the aspect of the present disclosure contains an inorganic powder, and enables the resin reinforced portion at the solder portion to be more strongly reinforced without using an underfill when used for soldering of an electronic component to a circuit board. This makes it possible to improve the drop resistance of a mount structure. Further, because the surface of the inorganic powder is covered with an organic resin, it is possible to weaken the effect that interferes with the flux's reducing effect during the melting of a solder powder. This improves the meltability of a solder powder.

DESCRIPTION OF EMBODIMENTS

Circumstances Behind the Present Disclosure

Figure 1:
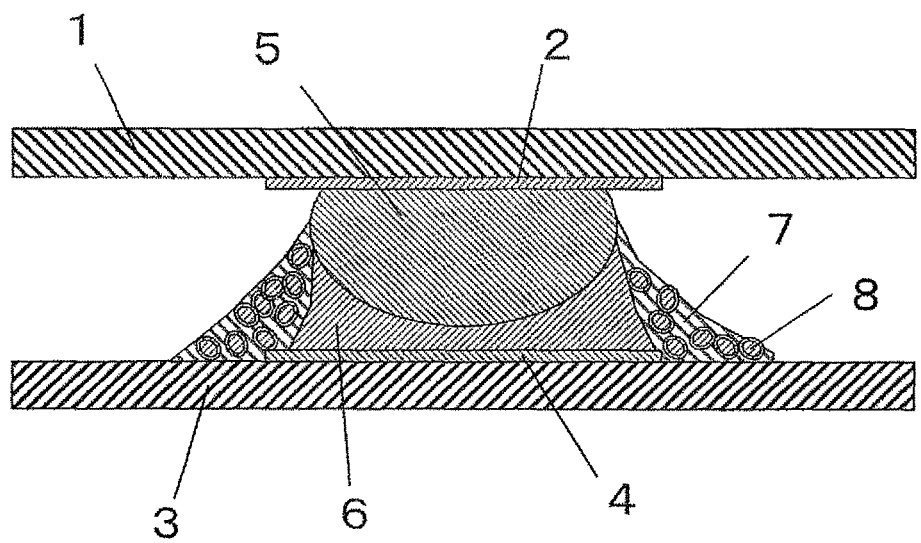
FIG. 1 is a cross sectional view showing a cross sectional structure of a mount structure joined with the use a resin fluxed solder paste of First Embodiment.

The present inventors investigated whether the need for the underfill process could be eliminated by containing an inorganic powder, such as silica, which is contained in the underfill, in the resin fluxed solder paste in advance. This led to the finding that a serious problem occurs when such a resin fluxed solder paste containing an inorganic powder together with the solder powder is heated. Specifically, the solder powder that should melt and join metals hardly melts, and fails to join metals. The solder hardly melted when the solder powder coexisted with inorganic powders such as silica, alumina, and talc, as will be described in Comparative Examples below. Particularly, the solder did not melt at all when alumina was used. Presumably, this is because the metal oxide inorganic powder inhibits the fluxing effect of the organic acid in the flux (a reduction reaction that removes the oxide film on the solder surface). Attempts were made to enhance the fluxing effect by increasing the amount of organic acid. However, no large improvements were observed even when the organic acid was added at 10 times the normal amount. These studies found that silica, alumina, and talc were among the metal oxide inorganic powders that have a very strong inhibitory effect on the fluxing.

Given this finding, the present inventors conducted preliminary investigations to determine whether coating the surface of inorganic powder silica could ease the inhibition of the reducing effect provided by the flux. Molten silica (particle size: 0.6 μm; manufactured by Micron) was used as the silica.

(1) Metal film coating was investigated as a method of coating the silica surface. Silver was chosen as the metal. A silver coating film was formed on the silica surface by non-electrolytic plating. The silver-coated silica was added to a resin fluxed solder paste to produce a paste. The solder powder melted after the paste was applied and heat melted using an ordinary method. However, the silver-coated silica particles surfaced to the outer surface of the epoxy resin in the cured portion. Specifically, a silver-coated silica layer was formed in different places, including the central solder portion, the cured portion of the epoxy resin surrounding the solder portion, and the outermost surface. In such a structure, the silver-coated silica forms a separate layer from the epoxy resin, and the epoxy resin and the silica do not easily combine. This is unlikely to achieve low thermal expansion and high strength.

(2) Epoxy resin (second epoxy resin) coating was investigated as a method of coating the silica surface. A resin fluxed solder paste inherently contains a solder powder in a liquid first epoxy resin. The first epoxy resin is highly compatible with the second epoxy resin that coats the silica surface. Various methods are available for the coating of the second epoxy resin on the silica surface, and the method is not particularly limited. However, in an uncured state, the second epoxy resin dissolves into the first epoxy resin when dispersed in the first epoxy resin in the form of a resin fluxed solder paste, and the silica coating film may be lost. The second epoxy resin that covers the silica surface is thus required to have a three-dimensional crosslinkage by being cured. Swelling of the second epoxy resin in the resin fluxed solder paste, and the film breakage can be prevented by curing the second epoxy resin.

The present disclosure was completed after finding that the effect that interferes with the melting of the solder powder could be reduced by coating the surface of the inorganic powder silica with an epoxy resin, and dispersing the coated inorganic powder in a resin fluxed solder paste.

A resin fluxed solder paste according to a first aspect includes: a non-resinic powder containing a solder powder and an inorganic powder; and a flux containing a first epoxy resin, a curing agent, and an organic acid, wherein the non-resinic powder accounts for 30 to 90 wt % of the total, and wherein the surface of the inorganic powder is covered with an organic resin.

According to a second aspect, the resin fluxed solder paste of the first aspect may be such that the solder powder is contained in 60 to 95 wt %, and the inorganic powder is contained in 5 to 40 wt % with respect to the total 100 wt % of the non-resinic powder.

According to a third aspect, the resin fluxed solder paste of the first or second aspect may be such that the inorganic powder with the organic resin covering the surface of the inorganic powder has an average particle size of 1.0 μm to 25 μm.

According to a fourth aspect, the resin fluxed solder paste of any one of the first to third aspects may be such that the inorganic powder is silica and that the organic resin is a second epoxy resin.

According to a fifth aspect, the resin fluxed solder paste of any one of the first to fourth aspects may be such that the solder powder is any one of 42Sn58Bi, 42Sn57Bi1.0Ag, and 16Sn56Bi28In.

A mount structure according to a sixth aspect includes: a circuit board having an electrode; an electronic component having a terminal; a conducting portion including a solder connecting the electrode of the circuit board and the terminal of the electronic component to each other; and a reinforcing portion covering at least a portion of surroundings of the solder, and containing a cured first epoxy resin in which an inorganic powder is dispersed, wherein the surface of the inorganic powder in the reinforcing portion is covered with an organic resin.

A method for producing a mount structure according to a seventh aspect includes: providing the resin fluxed solder paste of any one of the first to fifth aspects on at least one of an electrode of a circuit board, and a terminal of an electronic component to be mounted on the circuit board; disposing the electrode of the circuit board, and the terminal of the electronic component via the resin fluxed solder paste; and heating the resin fluxed solder paste to a temperature equal to or greater than the melting point of the solder powder to separate the resin fluxed solder paste into (i) a solder connecting the electrode and the terminal to each other, and (ii) a cured epoxy resin covering at least a portion of surroundings of the solder and resulting from curing of the first epoxy resin in which the inorganic powder with the organic resin covering the surface of the inorganic powder is dispersed, and to solder the electrode on the circuit board and the terminal of the electronic component to each other.

A resin fluxed solder paste, and a mount structure according to an embodiment are described below with reference to the accompanying drawings In the drawings, members that are essentially the same are given the same reference numerals.

First Embodiment

Resin Fluxed Solder Paste

A resin fluxed solder paste according to First Embodiment includes a non-resinic powder containing a solder powder and an inorganic powder; and a flux containing a first epoxy resin, a curing agent, and an organic acid. The non-resinic powder accounts for 30 to 90 wt % of the total. The remaining 10 to 70 wt % is the flux containing a first epoxy resin, a curing agent, and an organic acid. The surface of the inorganic powder is covered with an organic resin. The inorganic powder may be, for example, silica. The organic resin may be, for example, a second epoxy resin.

The resin fluxed solder paste contains an inorganic powder, and enables the resin reinforced portion at the solder portion to be more strongly reinforced without using an underfill when used for soldering of an electronic component to a circuit board. This makes it possible to improve the drop resistance of a mount structure. Further, because the surface of the inorganic powder is coated with organic resin, it is possible to weaken the effect that interferes with the flux's reducing effect during the melting of the solder powder. This makes it possible to improve the meltability of the solder powder.

The composition and the evaluation method of the resin fluxed solder paste are described below.

The resin component of the resin fluxed solder paste contains a first epoxy resin and a curing agent as main components.

First Epoxy Resin

The first epoxy resin cures at a relatively low temperature, and has high adhesion. The first epoxy resin thus enables mounting components with sufficient curability exhibited even at temperatures below the temperature of the traditional solder reflow process, and can exhibit a sufficient reinforcement effect. Other components, including solder particles, can be easily dispersed in the first epoxy resin when the first epoxy resin is mixed as an epoxy resin that is liquid at ordinary temperature. As used herein, "liquid at ordinary temperature" means that there is fluidity in a temperature range of 5° C. to 28° C., particularly at room temperature of about 18° C. under the atmospheric pressure. The epoxy resin that is liquid at ordinary temperature is not particularly limited in terms of a molecular weight and a molecular structure, provided that the epoxy resin has two or more epoxy groups within the molecule. Examples of such epoxy resins include various liquid epoxy resins, including glycidyl ether, glycidyl amine, glycidyl ester, and olefin oxidized (alicyclic) liquid epoxy resins. Specific examples include bisphenol epoxy resins, such as bisphenol A epoxy resins, and bisphenol F epoxy resins; hydrogenated bisphenol epoxy resins, such as hydrogenated bisphenol A epoxy resins, and hydrogenated bisphenol F epoxy resins; biphenyl epoxy resins, naphthalene ring-containing epoxy resins, alicyclic epoxy resins, dicyclopentadiene epoxy resins, phenol novolac epoxy resins, cresol novolac epoxy resins, triphenylmethane epoxy resins, aliphatic epoxy resins, and triglycidyl isocyanurate. These may be used either alone or in a combination of two or more. In terms of reducing the viscosity of a liquid epoxy resin composition used for sealing semiconductors, and improving the quality of the cured product, preferred as the epoxy resin that is liquid at ordinary temperature are bisphenol epoxy resins, and hydrogenated bisphenol epoxy resins. An epoxy resin that is solid at ordinary temperature may be used in combination. Examples of such epoxy resins that are solid at ordinary temperature include biphenyl epoxy resins, dicyclopentadiene epoxy resins, and triazine skeleton epoxy resins.

Curing Agent

The curing agent may be a common epoxy resin curing agent, for example, such as acid anhydrides, phenol novolac, various thiol compounds, various amines, dicyandiamide, imidazoles, metal complexes, and adduct compounds thereof, for example, such as an adduct modified product of polyamine. Imidazoles are desirable in terms of satisfying both single-component properties and solder meltability. Examples of imidazoles include 2-methylimidazole (trade name 2MZ), 2-undecylimidazole (trade name C11Z), 2-phenylimidazole (trade name 2PZ), 2-ethyl-4-methylimidazole (trade name 2E4MZ), 2-phenyl-4-methylimidazole (trade name 2P4MZ), 1-benzyl-2-methylimidazole (trade name 1B2MZ), 1-benzyl-2-phenylimidazole (trade name 1B2PZ), 1-cyanoethyl-2-methylimidazole (trade name 2MZ-CN), 1-cyanoethyl-2-ethyl-4-methylimidazole (trade name 2E4MZ-CN), 1-cyanoethyl-2-phenylimidazole (trade name 2PZ-CN), 1-cyanoethyl-2-undecylimidazole (trade name C11Z-CN), 1-cyanoethyl-2-phenylimidazolium trimellitate (trade name 2PZ-CNS), 1-cyanoethyl-2-undecylimidazolium trimellitate (trade name C11Z-CNS), 2,4-diamino-6-[2'-methylimidazolyl-(1')]-ethyl-s-triazine (trade name 2MZ-A) 2,4-diamino-6-[2'-undecylimidazolyl-(1')]-ethyl-s-triazine (trade name C11Z-A), 2,4-diamino-6-[2'-ethyl-4'-methylimidazolyl-(1')]-ethyl-s-triazine (trade name 2E4MZ-A), 2-phenyl-4-methyl-5-hydroxymethylimidazole (trade name 2P4MHZ), 2-phenyl-4,5-dihydroxymethylimidazole (trade name 2 PHZ), a 2,4-diamino-6-[2'-methylimidazolyl- (1')]-ethyl-s-triazineisocyan uric acid adduct (trade name 2MA-OK), and a 2-phenylimidazoleisocyanuric acid adduct (trade name 2PE-OK). These are all available from Shikohu Chemicals Corporation. Compounds obtained after adding these imidazoles to an epoxy resin also may be used. The curing agent may foe used in the form of a microcapsule by being coated with a polymer material such as a polyurethane or polyester polymer material.

The curing agent is used in an appropriately adjusted amount. Preferably, the amount is adjusted so that the stoichiometric equivalent ratio of the curing agent with respect to the epoxy equivalent of the first epoxy resin ranges from 0.8 to 1.2.

In addition to the first epoxy resin and the curing agent, the resin component may be mixed with a curing promoting agent, as required.

Curing Promoting Agent

Aside from imidazoles such as above, the curing promoting agent may be selected from: cyclic amines such as tertiary amines, 1,8-diazabicyclo(5.4.0)undecene-7, and 1,5-diazabicyclo(4.3.0)nonene-5, and tetraphenylborate salts thereof; trialkylphosphines such as tributylphosphine; triarylphosphines such as triphenylphosphine; quaternary phosphonium salts such as tetraphenylphosphonium tetraphenylborate, and tetra(n-butyl)phosphonium tetraphenyl borate; metal complexes such as Fe acetyl acetonate, and adduct compounds thereof. The content of the curing promoting agent is appropriately adjusted, taking into consideration factors such as gelation time, and storage stability.

Organic Acid

The organic acid mixed with the resin fluxed solder paste is not particularly limited, and, for example, rosin component materials such as abietic acid; various amines and salts thereof; and organic acids such as sebacic acid, adipic acid, glutaric acid, succinic acid, malonic acid, citric acid, and pimelic acid may be used. The organic acids have a desirable fluxing effect (as used herein, "fluxing effect" means the reducing effect that removes the oxide coating that has occurred on the metal surface to which the solder paste is applied, and the effect that lowers the surface tension of a molten solder to promote solder wettability for the soldered metal surface).

These organic acids may be used as a single component, or as a mixture of two or more components. Preferred among these organic acids are adipic acid and glutaric acid because these have high flux activity, and are stable as compounds.

Aside from the foregoing essential components, the resin fluxed solder paste of the embodiment of the present disclosure may contain common modifying agents and additives. In order to reduce the viscosity of the resin fluxed solder paste and impart fluidity, it is also possible to add a low-boiling-point solvent, or a plasticizer. It is also effective to add, for example, hydrogenated castor oil or stearic acid amide as a thixotropy imparting agent for maintaining the print shape.

Solder Powder

The solder powder used has a melting point of 240° C. or less. The lower limit of the melting point of the solder powder is preferably 130° C. or more, though it is not particularly limited. The solder balls of BGA and CSP semiconductors use a tin-silver-copper (SAC) solder powder. The SAC solder powder can be prevented from remelting by using a solder having a melting point below the melting point (240° C.) of the SAC solder powder. The composition of the solder powder is not particularly limited, and, for example, a Sn-based alloy may be used. Specifically, SnBi-based Sn42/Bi58 ($Sn_{0.42}Bi_{0.58}$), Sn42/Bi57/Ag1.0, and Sn16/Bi56/In28 are preferred.

In the resin fluxed solder paste, the proportion of the non-resinic powder configured from the solder powder and the inorganic powder is 30 to 90 wt % of the total, and the remaining 10 to 70 wt % is the flux containing the first epoxy resin, the curing agent, and the organic acid. When the proportion of the non-resinic powder is smaller than 30 wt %, the solder amount becomes smaller, and a sufficient electrical connection cannot be obtained. When the proportion of the non-resinic powder is larger than 90 wt %, the viscosity becomes excessively high, and printability suffers.

Inorganic Powder (Inorganic Filler)

The resin fluxed solder paste of the embodiment of the present disclosure contains an inorganic powder (hereinafter, also referred to as "inorganic filler"), in addition to the solder component. The inorganic filler has low thermal expansion, and can reduce the coefficient of thermal expansion, and increase the elastic modulus by being contained in the resin component.

The inorganic filler may use materials, for example, such as silica, alumina, and talc, commonly used in semiconductor sealants. In the resin fluxed solder paste, the solder powder and the inorganic filler coexist with the resin component.

In the non-resinic powder configured from the solder powder and the inorganic powder in the resin fluxed solder paste, the proportion (content) of the solder powder is preferably 60 to 95%, and the proportion (content) of the inorganic powder is preferably 5 to 40% with respect to the total amount of the non-resinic powder. In these ranges, the resin fluxed solder paste can sufficiently develop electrical connectivity to semiconductor components in the form of a cured product, and a reinforcement effect on the soldered portion with the reduced coefficient of thermal expansion and the increased elastic modulus of the resin component. A loss in the ease of coating procedure due to increased viscosity also can be reduced.

Figure 2:
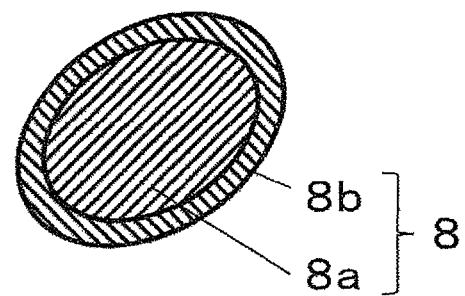
FIG. 2 is a cross sectional view showing a cross sectional structure of an inorganic particle surface-coated with an organic resin in the resin fluxed solder paste of First Embodiment.

FIG. 2 is a cross sectional view of a cross sectional structure of an inorganic powder 8 in the resin fluxed solder paste. The surface of the core 8a of the inorganic powder 8 is covered with an organic resin 8b. The organic resin 8b may be, for example, an epoxy resin. The organic resin 8b covering the surface of the core 8a of the inorganic powder 8 is not limited to an epoxy resin. The organic resin 8b may be, for example, a phenol resin or an epoxy resin. Epoxy resins are preferred in terms of factors such as dispersibility in the first epoxy resin, and compatibility with the first epoxy resin. The epoxy resin covering the surface of the inorganic powder is not necessarily the same epoxy resin used as the first epoxy resin, and is referred to as "second epoxy resin".

Second Epoxy Resin

The film of the second epoxy resin formed on the surface of the inorganic powder desirably has a thickness of 0.1 to 25 μm to prevent swell breakage of the resin. When the thickness of the cured film of the second epoxy resin is thinner than 0.1 μm, the film strength suffers, and the swelling of the epoxy binder destroys the coating, and makes the inorganic powder insufficiently coated in portions of the surface. This tends to cause poor melting of the solder powder. When the thickness of the cured film of the second epoxy resin is thicker than 25 μm, the thermal expansion lowering effect of the inorganic powder becomes weaker.

The inorganic powder coated with the cured film of the second epoxy resin contained in the resin fluxed solder paste desirably has an average particle size of 1.0 μm to 25 μm. The viscosity of the resin fluxed solder paste composition increases, and ease of handling suffers when the average particle size of the inorganic powder covered with the cured film of the second epoxy resin is less than 1.0 μm. When the average particle size of the inorganic powder is larger than 25 μm, the inorganic powder fails to move, and cannot be evenly dispersed in the resin component when the solder is metalized and agglomerates. In this case, the effect that lowers the thermal expansion of the first epoxy resin cannot be effectively exhibited.

Resin Fluxed Solder Paste Producing Method

An example of a resin fluxed solder paste producing method is described below.

(1) First, a solder powder having a melting point of 240° C. or less, a portion of the first epoxy resin or the whole first epoxy resin, a curing agent, and a flux component are mixed with one other.

(2) An inorganic powder with an organic resin film covering the surface of the inorganic powder is then added and mixed with the mixture, together with the remaining portion of the first epoxy resin when only a portion of the first epoxy resin was used.

This produces a resin fluxed solder paste.

In this way, the product resin fluxed solder paste can have the flux component blended around the solder powder, and can efficiently develop storage stability under room temperature, while allowing the solder powder to efficiently melt under heat.

The resin fluxed solder paste produced in the manner described above contains the first epoxy resin and the curing agent as resin components, and can reduce viscosity increase under room temperature. The resin fluxed solder paste thus has high storage stability.

Further, because the surface of the inorganic powder is covered with an organic resin, it is possible to reduce the effect that interferes with the reducing effect of the flux organic acid during the melting of the solder powder. This makes it possible to improve the meltability of a solder powder.

Mount Structure

FIG. 1 is a cross sectional view of a mount structure 20 joined with the use of a resin fluxed solder paste 10 according to First Embodiment. The mount structure 20 has a structure in which the terminal 2 of an electronic component 1, and the electrode 4 of a circuit board 3 are joined to each other with, for example, a SAC solder bump 5 and a SnBi low-temperature-solder 6, and in which a first epoxy resin 7 is cured to reinforce the surroundings of the solders 5 and 6. In the first epoxy resin 7 is dispersed in inorganic powder 8 in which the surface of the core 8a is covered with a resin film (for example, a film formed by a cured second epoxy resin) 8b.

In the mount structure 20 using the resin fluxed solder paste 10, the SAC solder 5 on the terminal 2 of the electronic component CSP chip 1 is joined to the electrode 4 of the circuit board 3 with the low-temperature-solder 6, and the resin 7 covers the surroundings of the solders. Specifically, a structure is formed in which the first epoxy resin 7 reinforces the conducting portion formed by the solders 5 and 6. The reinforcing portion formed by the first epoxy resin 7 can have a structure in which the surface of the inorganic powder (silica) core 8a is covered with the organic resin (second epoxy resin) 8b. The reinforcing portion contains the silica 8 having a low coefficient of thermal expansion and a high elastic modulus, and has a desirable reinforced structure. This makes the mount structure 20 highly reliable against dropping.

The mount structure can be obtained by, for example, joining the terminal of an electronic component and the electrode of a circuit board to each other with the resin fluxed solder paste in which the inorganic powder surface-coated with the organic resin is dispersed.

Mount Structure Producing Method

FIGS. 3A to 3D are cross sectional views representing steps of the method of production of the mount structure 20 according to First Embodiment. The mount structure can be obtained by mounting an electronic component, specifically a semiconductor component, on, for example, a circuit board having conductive wires, using the resin fluxed solder paste. The semiconductor device 20 as a mount structure includes a joint where the terminal 2 of the semiconductor component 1 and the electrode 4 of the circuit board 3 are joined to each other with the resin fluxed solder paste 10.

Figure 3A:
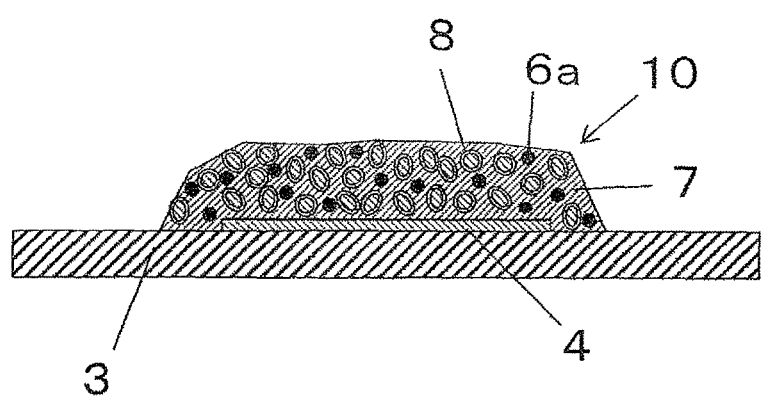
FIG. 3A is a schematic cross sectional view representing a step of applying the resin fluxed solder paste to an electrode on a circuit board in the production of a mount structure according to an embodiment.

(1) First, the resin fluxed solder paste 10 is applied to the electrode 4 of the circuit board 3 (FIG. 3A). The resin fluxed solder paste 10 contains a resin flux 7, a SnBi powder 6a, and an inorganic powder 8 in which the surface of the core 8a is covered with an organic resin 8b. In a mount step using the resin fluxed solder paste 10, the resin fluxed solder paste 10 is printed on a predetermined position of the circuit board 3, for example, on the wire electrode 4, using a metal mask (not illustrated). For example, a metal mask (not illustrated) having a through hole corresponding in position to the electrode 4 is laid over the circuit board 3. The resin fluxed solder paste 10 is then applied to the surface of the metal mask, and the through hole is filled with the resin fluxed solder paste 10 using a squeegee. Removing the metal mask from the circuit board 3 results in the resin fluxed solder paste 10 being applied to each electrode 4 of the circuit board 3.

Figure 3B:
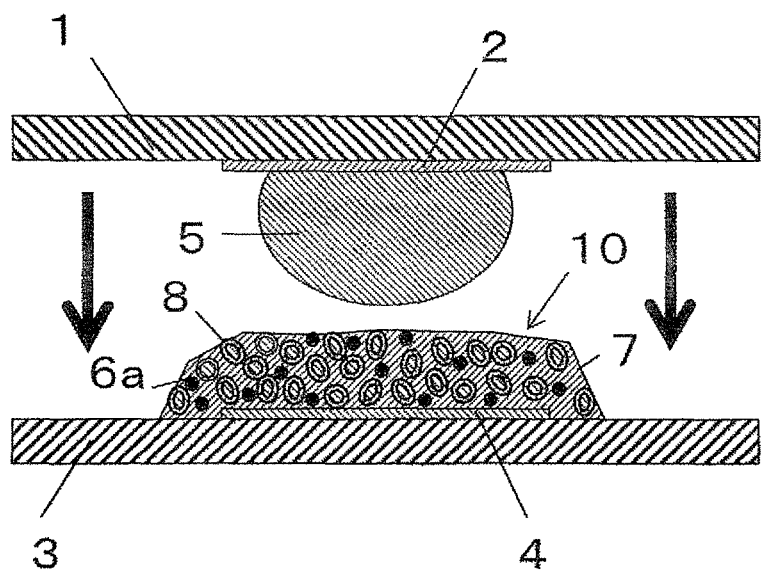
FIG. 3B is a schematic cross sectional view representing a step of stacking a semiconductor component and the circuit board in such an orientation that the terminal of the semiconductor component faces the electrode of the circuit board, using a tool such as a chip mounter.

(2) While the resin fluxed solder paste 10 is in an uncured state, the semiconductor component 1 and the circuit board 3 are stacked with the terminal 2 of the semiconductor component 1 and the electrode 4 of the circuit board 3 facing each other, using a tool such as a chip mounter (FIG. 3B). Here, the semiconductor component 1 may be, for example, a CSP or BGA semiconductor package having a solder ball 5 as the terminal 2, or a QFP semiconductor package provided with a lead terminal. The semiconductor component 1 also may be a semiconductor element (bare chip) provided with a terminal 2 without being housed in a package.

Figure 3C:
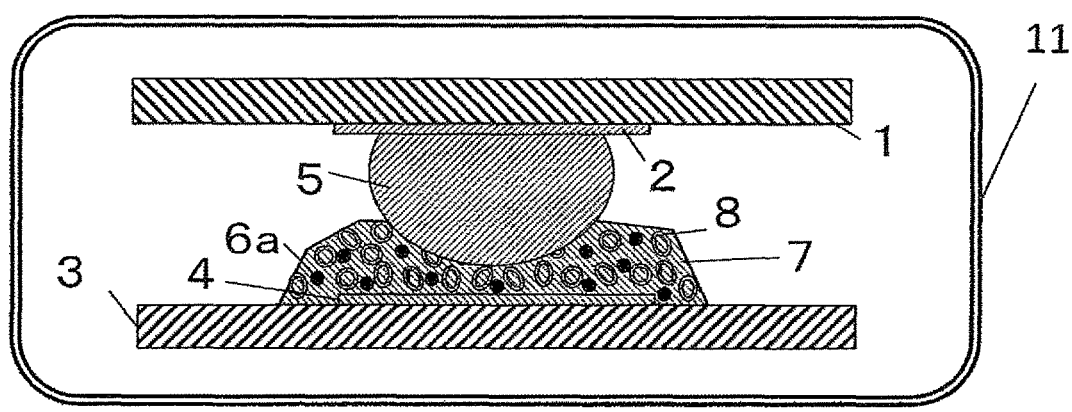
FIG. 3C is a schematic cross sectional view representing a step of heating the resin fluxed solder paste to a predetermined heating temperature in a reflow furnace.

(3) In this state, the circuit board 3 with the semiconductor component 1 is subjected to, for example, a solder reflow process, in which the resin fluxed solder paste 10 is heated to a predetermined heating temperature in a reflow furnace 11 (FIG. 3C). By heating the resin fluxed solder paste 10, the resin flux 7 as a resin component and the solder powder 6a in the mixture of the resin flux 7 and the solder powder 6a separate from each other in the process of melting the solder, and a reinforced structure is formed in which the resin covers the surroundings of the molten solder 6. As a result of reinforcement, the strength of the solder portion increases, and the impact reliability can improve. The heating temperature is appropriately set to a temperature that sufficiently melts the solder powder 6a, and at which the cure reaction of the resin component sufficiently proceeds. Preferably, the heating temperature is set so that the agglomeration of the solder powder 6a will not be inhibited by the progression of the cure reaction of the first epoxy resin before the solder powder 6a completely melts. The preferred heating temperature to this end is a temperature that is 10° C. to 60° C. higher than the melting point of the solder powder.

Figure 3D:
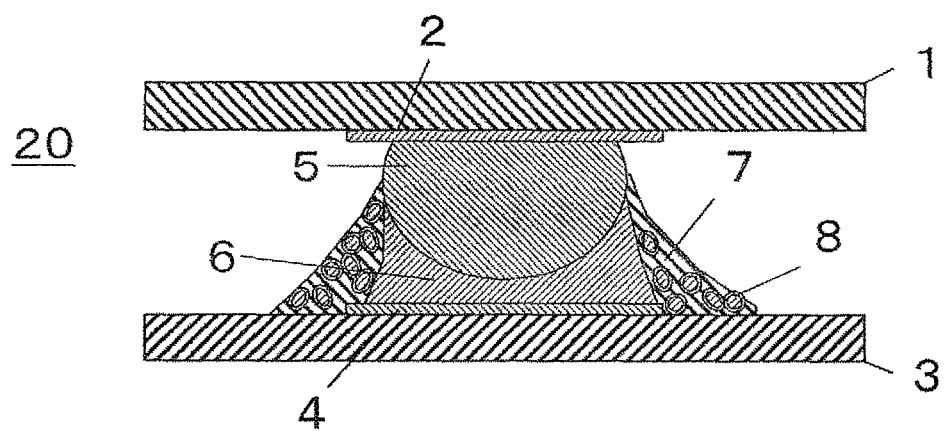
FIG. 3D is a schematic cross sectional view representing a heating step involving a heating temperature that melts the solder powder in the resin fluxed solder paste, and the solder ball provided at the terminal of the semiconductor component.
Figure 4:
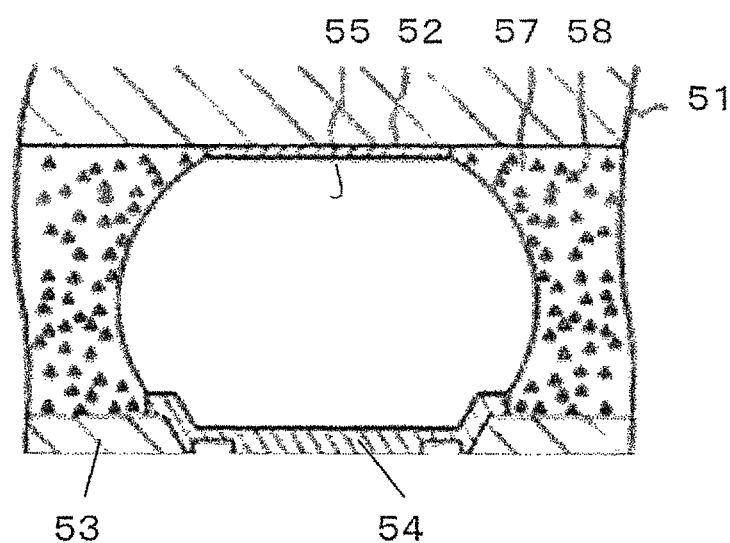
FIG. 4 is a schematic cross sectional view of a mount structure that has been reinforced with an underfill after traditional solder ball connection.

(4) Thereafter, the resin fluxed solder paste 10 is heated by reflow to a temperature that melts the solder powder 6a contained in the resin fluxed solder paste 10, and the solder ball 5 provided at the terminal 2 of the semiconductor component 1 (FIG. 3D). The resin flux has the effect to chemically remove the oxide film on the surface of the soldered electrode 2, and the oxide film on the surface of the solder powder 6a by a reduction reaction. Specifically, the resin flux develops the fluxing effect to enable melting and soldering. Here, the inorganic powder 8 is less likely to interfere with the fluxing effect of the organic acid because the inorganic powder 8, for example, silica, is surface-coated with the organic resin 8b, for example, the second epoxy resin. The heating also cures the resin fluxed solder paste 10, and provides a solder portion where the semiconductor component 1 and the circuit board 3 are electrically connected to each other. Specifically, the solder 6 that has melted under the heat integrates with the solder ball 5, and forms a solder portion. As the solder powder melts and concentrates on the electrode 4 under the cohesive force of the metal, the inorganic powder 8 contained in the resin fluxed solder paste 10 becomes uniformly dispersed in the resin component 7 covering the surroundings of the molten solder 6, and solidifies upon curing of the resin component 7. Specifically, a single heat reflow step includes both the formation of the solder portion joining the wire electrode 4 of the circuit board 3 and the terminal 2 of the semiconductor component 1, and the formation of the reinforcing portion by the curing of the epoxy resin.

As described above, a joint is formed by the solder portion (conducting portion s where the molten solder 6 and solder ball 5 melt and integrate, and the cured portion (reinforcing portion) covering the surroundings of the solder portion, and containing a cured first epoxy resin in which the inorganic powder is dispersed.

In this manner, the semiconductor device 20 as a mount structure is produced as the solder portion electrically joins the semiconductor component 1 and the circuit board 3 to each other, and the reinforcing portion containing the inorganic powder 8 provides a mechanically reinforced structure with which the semiconductor component 1 is mounted in the mount structure.

EXAMPLES

The present disclosure is described below using Examples and Comparative Examples. The present disclosure, however, is in no way limited by the following detailed descriptions based on Examples. The contents shown in Tables 1 and 2 are parts by mass (weight parts). The components shown in Tables 1 and 2 are as follows.

Production of Second Epoxy Resin-Coated Silica (1) A 1:1 equivalent mixture of a liquid epoxy resin and a curing agent was weighed in a container as an epoxy resin composition.

(2) A 1:1 weight ratio mixed solvent of IPA (isopropyl alcohol) and acetone was then added in 10 parts with respect to 90 parts of the epoxy resin composition to produce a solvent diluted solution of the epoxy resin composition.

(3)

Molten silica of various particle sizes were prepared: (a) a particle size of 1 μm (SO-25R: Micron), (b) a particle size of 5 μm (FB-5D: Denka Company), (c) a particle size of 11 μm (FB-12D: Denka Company), and (d) a particle size of 22 μm (FB-20D: Denka Company). The molten silica was added to the solvent diluted solution at a silica:solvent diluted solution weight ratio of 80:20.

(4) The silica added mixture was sealed by placing a cap, and thoroughly stirred with a planetary mixer so as to uniformly cover the silica surface with the mixed solution.

(5) The solvent was removed with a dryer at 70° C. for 1 h, and the remaining product was heated at 120° C. for 30 min to cure the epoxy resin film on the silica surface.

(6) The heat-treated silica coated with the epoxy resin (second epoxy resin) was cohesive, and the agglomerates were broken down with a pulverizer.

(7) The coarse particles were removed through a 100-mesh sieve (aperture size of 149 μm).

Note that it was possible to reduce the agglomeration when the particles were stirred every several minutes while being heated at 120° C. for 30 min. after the solvent was removed at 70° C. for 1 h. In this way, the silica surface was less exposed through the epoxy resin film after pulverization.

The silica covered with the epoxy resin had an average particle size of 5.0 μm to 25 μm.

Production of Resin Fluxed Solder Paste

1) Solder powder: A solder composition (Sn42Bi58) specified by JIS H42B:58A. The solder powder was produced according to an ordinary method. The solder particles had an average particle size of 15 μm, and a melting point of 139° C.

2) Second epoxy resin-coated silica: The silica produced by using the foregoing method.

3) First epoxy resin; Bisphenol F-type epoxy resin (Epikote 806: manufactured by Japan Epoxy Resin)

4) Curing agent: Imidazole-based curing agent 2-phenyl-4 methyl-5-hydroxymethylimdazole (trade name: 2P4MHZ; manufactured by Shikoku Chemicals Corporation)

5) Organic acid: Glutaric acid (manufactured by Kanto Kagaku)

6) Thixotropy imparting material: Thixcin R (glyceryl trioxystearate: manufactured by Elementis Japan)

A conductive adhesive configured from an organic acid-containing adhesive, and a SnBi-based solder powder was produced from these materials in the following formulation.

The components 3) to 6) were uniformly mixed with a planetary mixer.

The components 1) and 2) were added to the mixture, and kneaded to produce a resin fluxed solder paste.

Production of Device for Evaluation

The resin fluxed solder paste was applied to a Au-plated electrode on a circuit board (FR-4 substrate) through a metal mask in a print thickness of 0.1 mm.

A CSP semiconductor package having a size of 11 mm×11 mm, including 441 bumps at a pitch of 0.5 mm, and made of a glass epoxy as substrate material was precisely mounted on the circuit board having a size of 3 cm×7 cm and a thickness of 0.8 mm and made of copper as electrode material using a flip-chip bonder.

These were connected upon being heated with a reflow device (160° C., 6 min).

Evaluation Method (1) Printability: The printability of the resin fluxed solder paste on the circuit board was evaluated by checking mask transferability, and checking for any dripping or bridge in the print.

Samples that were transferable through the mask, and had the intended shapes were evaluated as "Excellent". Samples that were transferable but had a slight shape problem were evaluated as "Good". Samples with considerably poor shapes were evaluated as "Poor".

(2) Solder meltability: The solder melted by the reflow of the substrate with the applied resin fluxed solder paste was visually inspected, and the molten state of the solder was evaluated.

Samples with no unmelted solder were evaluated, as "Good". Samples with a few unmelted portions were evaluated as "Acceptable". Samples with no melting were evaluated as "Poor".

(3) Drop resistance: The evaluation CSP package obtained in the manner described above was subjected to a CSP package drop test. Specifically, the mount structure was dropped from a height of 100 cm, and measured for the connectivity of the CSP package, and the presence or absence of conduction in the daisy chain pattern of ball joints. Samples were evaluated as "Excellent" when a conduction failure occurred after being dropped more than 100 times. Samples that had a conduction failure after 50 to 100 drops were evaluated as "Good". Samples were evaluated as "Poor" when a conduction failure occurred before 50 drops, or even before being dropped.

(4) Total Evaluation: Samples were evaluated as "Excellent" when samples had two or more "Good" scores in the evaluations (1) to (3). Samples with only one "Good" score were evaluated as "Good", and Samples were evaluated as "Poor" when the evaluations had even one "Poor" score.

Example 1 is described below. A Sn42/Bi58 solder was used. The molten silica (d) used had a particle size of 22 μm (FB-20D: Denka Company). In the paste composition, the proportion of the non-resinic powder configured from the solder powder and the second epoxy resin-coated silica was 90 wt % of the total, and the flux component including a first epoxy resin, a curing agent, and an organic acid accounted for 10 wt % of the total. The surface of the silica is coated with a second epoxy resin by a surface treatment. The proportion of the silica in the mixture of the solder powder and the second epoxy resin-coated silica was 40% of the total non-resinic powder. Table 1 shows the formulation of the resin fluxed solder paste.

Tables 2 shows the results of the (1) printability evaluation, (2) solder meltability evaluation, and (3) drop resistance evaluation of the resin fluxed solder paste. The printability was slightly undesirable in terms of mask transferability, but the solder melt-ability and the drop resistance were desirable.

TABLE 1

| | Resin fluxed solder paste | | | | | | |
|---|---|---|---|---|---|---|---|
| | Resin component | Non-resinic powder | Solder powder | | Inorganic powder | | |
| | | | | | | Particle | |
| | (parts by weight) | (parts by weight) | Type | Parts by weight | Type | Surface treatment | size (μm) | Parts by weight |
| Ex. 1 | 10 | 90 | SB | 54 | Silica (d) | Present | 25 | 36 |
| Ex. 2 | 10 | 90 | SB | 85.5 | Silica (a) | Present | 3 | 4.5 |
| Ex. 3 | 30 | 70 | SB | 42 | Silica (c) | Present | 14 | 28 |
| Ex. 4 | 30 | 70 | SB | 56 | Silica (b) | Present | 8 | 14 |
| Ex. 5 | 70 | 30 | SB | 18 | Silica (a) | Present | 3 | 12 |
| Ex. 6 | 30 | 70 | SB | 42 | Silica (c) | Present | 14 | 28 |
| Ex. 7 | 30 | 70 | SB | 56 | Silica (b) | Present | 8 | 14 |
| Ex. 8 | 30 | 70 | SBA | 42 | Silica (d) | Present | 25 | 28 |
| Ex. 9 | 30 | 70 | SBI | 42 | Silica (b) | Present | 8 | 28 |
| Com. Ex. 1 | 30 | 70 | SB | 70 | — | — | — | 0 |
| Com. Ex. 2 | 30 | 70 | SB | 42 | Silica (b) | Absent | 8 | 28 |
| Com. Ex. 3 | 90 | 10 | SB | 6 | Silica (a) | Present | 3 | 4 |

TABLE 2

| | Solder | Drop resistance | | Final |
|---|---|---|---|---|
| | Printability | meltability | Count | Evaluation | evaluation |
| Ex. 1 | Good | Good | 90 | Good | Excellent |
| Ex. 2 | Good | Good | 70 | Good | Good |
| Ex. 3 | Excellent | Good | more than 100 | Excellent | Excellent |
| Ex. 4 | Excellent | Good | 100 | Good | Excellent |
| Ex. 5 | Good | Good | 50 | Good | Good |
| Ex. 6 | Good | Good | more than 100 | Excellent | Excellent |
| Ex. 7 | Good | Good | more than 100 | Excellent | Excellent |
| Ex. 8 | Excellent | Good | more than 100 | Excellent | Excellent |
| Ex. 9 | Excellent | Good | more than 100 | Excellent | Excellent |
| Com. Ex. 1 | Excellent | Good | 40 | Poor | Poor |
| Com. Ex. 2 | Excellent | Poor | Fail | Poor | Poor |
| Com. Ex. 3 | Good | Acceptable | 5 | Poor | Poor |

In Example 2, the proportion of the non-resinic powder was 90 wt %, as in Example 1. The molten silica (a) used had a particle size of 1 μm. The proportion of the silica in the mixture of the solder powder and the silica was of the total non-resinic powder.

In Example 3, the proportion of the non-resinic powder was 70 wt %. The molten silica (c) used had a particle size of 11 μm. The proportion of the silica in the mixture of the solder powder and the silica was 40% of the total non-resinic powder.

In Example 4, the proportion of the non-resinic powder was 70 wt %. The molten silica (b) used had a particle size of 5 µm. The proportion of the silica in the mixture of the solder powder and the silica was 20% of the total non-resinic powder.

In Example 5, the proportion of the non-resinic powder was 30 wt %. The molten silica (a) used had a particle size of 1 µm. The proportion of the silica in the mixture of the solder powder and the silica was 40% of the total non-resinic powder.

In Example 6, the proportion, of the non-resinic powder was 70 wt %, as in Example 3. The molten silica (c) used had a particle size of 11 µm. The proportion of the silica in the mixture of the solder powder and the silica was 40% of the total non-resinic powder.

In Example 7, the proportion of the non-resinic powder was 70 wt %, as in Example 3. The proportion of the silica in the mixture of the solder powder and the silica was 20% of the total non-resinic powder. The molten silica (b) used had a particle size of 5 µm.

In Example 8, the proportion of the non-resinic powder was 70 wt %, as in Example 3. The molten silica (d) used had a particle size of 22 µm. The proportion of the silica in the mixture of the solder powder and the silica was 40% of the total non-resinic powder. A Sn42/Bi57/Ag1.0 (abbreviated to SBA) solder powder was used.

In Example 9, the proportion of the non-resinic powder was 70 wt %, as in Example 3. The molten silica (b) used had a particle size of 5 µm. The proportion of the silica in the mixture of the solder powder and the silica was 40% of the total non-resinic powder. A Sn16/Bi56/In28 (abbreviated to SBI) solder powder was used.

In Comparative Example 1, the proportion of the non-resinic powder was 70 wt %, as in Example 3. The non-resinic powder was solely a solder powder.

In Comparative Example 2, the proportion of the non-resinic powder was 70 wt %, as in Example 3. The molten silica (b) used had a particle size of 5 µm. The proportion of the silica in the mixture of the solder powder and the silica was 40% of the total non-resinic powder. However, the silica was hot subjected to a surface treatment.

In Comparative Example 3, the proportion of the non-resinic powder was 10 wt %. The molten silica (a) used had a particle size of 1 µm. The proportion of the silica in the mixture of the solder powder and the silica was 40% of the total non-resinic powder.

It can be discussed from the results shown in Tables 1 and 2 that the drop resistance is desirable when the proportion of the non-resinic powder is 30 to 90 wt %. It can also be seen that the drop resistance significantly improves when the silica coated with the second epoxy resin is added.

As demonstrated in Comparative Example 2, it was found that adding silica uncoated with the second epoxy resin results in poor solder meltability, and a connection failure.

The particle size of the second epoxy resin-coated silica does not have a significant effect on drop resistance. For printability, however, the coarse particles have effect on dripping after printing, and adversely affect the printability as the fine particles fail to smoothly move through the mask during printing.

It was also found that desirable drop resistance can be obtained regardless of whether the solder powder is Sn42/Bi58, Sn42/Bi57/Ag1.0, or Sn16/Bi56/In28, as demonstrated in Examples 8 and 9.

The present disclosure encompasses appropriate combinations of any of the Embodiments and/or Examples described above, and can exhibit effects produced by such combinations of Embodiments and/or Examples.

INDUSTRIAL APPLICABILITY

The resin fluxed solder paste and the mount structure according to the present disclosure have a wide range of applications in the technical field of electrical and electronic circuit formation. For example, the resin fluxed solder paste according to the present disclosure has use in the connection of electronic components such as CCDs, hologram devices, and chip components, and in the joining of such components to a substrate. Examples of other applicable areas include products in which such devices, components, or substrates are installed, for example, such as DVD devices, cell phones, portable AV devices, and digital cameras.

What is claimed is:

1. A resin fluxed solder paste comprising:
   a non-resinic powder containing a solder powder and an inorganic powder; and
   a flux containing a first epoxy resin, a curing agent, and an organic acid,
   wherein the non-resinic powder accounts for 30 to 90 wt % of the total,
   wherein the surface of the inorganic powder is covered with an organic resin, and
   wherein the inorganic powder with the organic resin covering the surface of the inorganic powder has an average particle size of 1.0 µm to 25 µm.

* * * * *